(12) United States Patent
Jeng (10) Patent No.: US 9,991,269 B2
(45) Date of Patent: Jun. 5, 2018

(54) NON-OVERLAPPED-EXTENSION-IMPLANTATION NONVOLATILE MEMORY DEVICE CAPABLE OF BEING TREATED WITH ANTI-FUSE OPERATION

(71) Applicant: Chung Yuan Christian University, Taoyuan (TW)

(72) Inventor: Syang-Ywan Jeng, Taipei (TW)

(73) Assignee: CHUNG YUAN CHRISTIAN UNIVERSITY (TW)

( * ) Notice: Subject to any disclaimer, the term of this patent is extended or adjusted under 35 U.S.C. 154(b) by 0 days. days.

(21) Appl. No.: 15/595,944

(22) Filed: May 16, 2017

(65) Prior Publication Data

US 2017/0338236 A1 Nov. 23, 2017

(30) Foreign Application Priority Data

May 18, 2016 (TW) .............................. 105115296 A (51) Int. Cl.
| | |
|---|---|
| H01L 29/76 | (2006.01) |
| H01L 29/94 | (2006.01) |
| H01L 27/112 | (2006.01) |
| H01L 29/78 | (2006.01) |
| H01L 29/06 | (2006.01) |
| H01L 21/263 | (2006.01) |

(52) U.S. Cl.
CPC ...... *H01L 27/11206* (2013.01); *H01L 21/263* (2013.01); *H01L 29/0649* (2013.01); *H01L 29/7835* (2013.01)

(58) Field of Classification Search
CPC ............. H01L 29/7833; H01L 29/7835; H01L 29/402; H01L 21/265; H01L 27/11206
USPC ........................................................ 257/344
See application file for complete search history.

(56) References Cited

U.S. PATENT DOCUMENTS 6,613,637 B1 * 9/2003 Lee .................. H01L 29/66477
257/E21.409

* cited by examiner

*Primary Examiner* — Theresa T Doan (57) ABSTRACT

The present invention provides a non-overlapped-extension-implantation (NOI) nonvolatile memory device capable of being treated with anti-fuse operation. Differing from conventional anti-fuse memory devices, the structure and fabrication of this NOI nonvolatile memory device are complied with currently-used standard COMS processes; that is, the NOI nonvolatile memory device provided by the present invention can be manufactured through the standard COMS processes, without using any additional masks for defining specific oxide layer. The most important is that, after the NOI nonvolatile memory device is treated with the anti-fuse operation, the Gate and Drain of the NOI nonvolatile memory device still propose the switching characteristic the same to the traditional MOSFET, resulting from the oxide breakdown caused by a high electric filed merely occur in an overlapped oxide segment of the gate oxide layer.

5 Claims, 8 Drawing Sheets

NON-OVERLAPPED-EXTENSION-IMPLANTATION NONVOLATILE MEMORY DEVICE CAPABLE OF BEING TREATED WITH ANTI-FUSE OPERATION

BACKGROUND OF THE INVENTION

1. Field of the Invention

The present invention relates to the technology field of one-time-program (OTP) nonvolatile memories, and more particularly to a non-overlapped-extension-implantation (NOI) nonvolatile memory device capable of being treated with anti-fuse operation.

2. Description of the Prior Art

Programmable read-only memory (PROM) is one kind of nonvolatile memory storing at least one bit by using a specific programming way such as fuse or anti-fuse operation. The difference between the PROM and the narrow-meaning ROM (i.e., the Mask ROM) is that, the former can be commercially manufactured to a fuse memory device or an anti-fuse memory device for providing users to execute data writing operation. However, the latter can only be programmed with bit(s) during device or chip fabrication.

A typical fuse memory device has an initial bit "1", and the bit "1" can be changed to "0" by treating the fuse memory device with a fuse operation; wherein the bit "1" and the bit "0" represent short circuit and open circuit in the sense of electronic circuits. In contrast to the fuse memory device, a typical anti-fuse memory device has an initial bit "0", and the bit "0" can be changed to bit "1" by treating the anti-fuse memory device with an anti-fuse operation. Of course, the above-introduced definition on bit "0" and bit "1" may be not exclusive. In different applications of electronic circuits, an inverted definition on the bit "0" and the bit "1" could be adopted depending on the particularly-designed read circuits for the fuse or anti-fuse memories.

Figure 1:
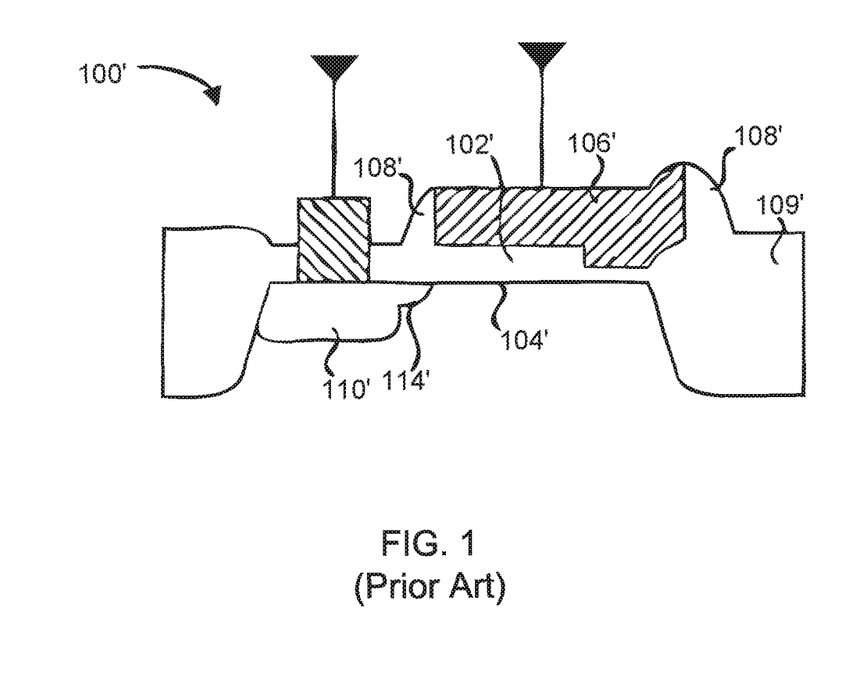
FIG. 1 shows a schematic cross-sectional view of a conventional anti-fuse memory device.

Please refer to FIG. 1, which shows a schematic cross-sectional view of a conventional anti-fuse memory device. The anti-fuse memory device 100' shown by FIG. 1 is proposed by Sidense Cooperation in Canada, and consists of: a substrate channel 104', a thickness-variable gate oxide 102', a poly-Si gate 106', two sidewall spacers 108', a field oxide (FOX) 109', a diffusion region 110', and an LDD region (Lightly Doped Drain) 114'. In the anti-fuse memory device 100', the said thickness-variable gate oxide 102' includes a thick oxide segment and a thin oxide segment. As FIG. 1 shows, one portion of the substrate channel 104' is covered by the thick oxide segment, and others portion of the substrate channel 104' is covered by the thin oxide segment. In the operation of the anti-fuse memory device 100', users are able to apply an anti-fuse operation to the anti-fuse memory device 100' so as to make the thin gate oxide occur oxide breakdown. Opposite to the thin gate oxide, the oxide breakdown does not happened in the thick gate oxide the during anti-fuse operation.

In spite of the conventional anti-fuse memory device 100' has become a currently-used programmable read-only memory (PROM), the conventional anti-fuse memory device 100' has revealed some drawbacks and shortcomings in practical application; wherein the drawbacks and shortcomings showed by the conventional anti-fuse memory device 100' are as follows:

when manufacturing the anti-fuse memory device 100', a first oxide layer mask and a second oxide layer mask are necessary in order to fabricate the thick oxide segment and the thin oxide segment of the thickness-variable gate oxide 102', and that causes the whole manufacturing cost of the anti-fuse memory device 100' be greater than commercially-used MOSFET (Metal-Oxide-Semiconductor Field-Effect Transistor) device.

Accordingly, in view of the conventional anti-fuse memory device 100' still include drawbacks, the inventor of the present application has made great efforts to make inventive research thereon and eventually provided a non-overlapped-extension-implantation (NOI) nonvolatile memory device capable of being treated with anti-fuse operation.

SUMMARY OF THE INVENTION

The primary objective of the present invention is to provide a non-overlapped-extension-implantation (NOI) nonvolatile memory device capable of being treated with anti-fuse operation. Differing from conventional anti-fuse memory devices, the structure and fabrication of this NOI nonvolatile memory device are complied with currently-used standard COMS processes; that is, the NOI nonvolatile memory device provided by the present invention can be manufactured through the standard COMS processes, without using any additional masks for defining specific oxide layer. The most important is that, after the NOI nonvolatile memory device is treated with the anti-fuse operation, the Gate and Drain of the NOI nonvolatile memory device still propose the switching characteristic the same to the traditional MOSFET, resulting from the oxide breakdown caused by a high electric filed merely occur in an overlapped oxide segment of the gate oxide layer.

In order to achieve the primary objective of the present invention, the inventor of the present invention provides a non-overlapped-extension-implantation (NOI) nonvolatile memory device capable of being treated with anti-fuse operation, comprising:

a silicon substrate;
a gate oxide layer, formed on the silicon substrate;
a gate layer, formed on the gate oxide layer;
a first diffusion region, formed in the silicon substrate;
a lightly doped drain (LDD) region, formed in the silicon substrate and adjacent to the first diffusion region; wherein the gate oxide layer has an overlapped oxide segment between the gate layer and the LDD region;
a second diffusion region, formed in the silicon substrate opposite to the first diffusion region; and
a non-lightly doped drain (non-LDD) region, formed in the silicon substrate and adjacent to the second diffusion region; moreover, the non-LDD region oppositely locates below the gate layer;
wherein a high electric filed would be induced in the overlapped oxide segment by forming a voltage difference between the gate layer and the silicon substrate; therefore, the high electric filed makes the overlapped oxide segment occur oxide breakdown, so as to carry out the anti-fuse operation on the NOI nonvolatile memory device.

Moreover, for achieving the primary objective of the present invention, the inventor of the present invention provides another embodiment for the non-overlapped-extension-implantation (NOI) nonvolatile memory device, comprising:

a silicon substrate;
a gate oxide layer, formed on the silicon substrate;
a gate layer, formed on the gate oxide layer;

a diffusion region, formed in the silicon substrate;
a non-lightly doped drain (non-LDD) region, formed in the silicon substrate and adjacent to the diffusion region; moreover, the non-LDD region oppositely locates below the gate layer; and
a shallow trench isolation (STI) oxide region, formed in the silicon substrate opposite to the diffusion region; wherein the gate oxide layer has an overlapped oxide segment locating between the gate layer and the STI oxide region;
wherein a high electric filed would be induced in the overlapped oxide segment by forming a voltage difference between the gate layer and the silicon substrate; therefore, the high electric filed makes the overlapped oxide segment occur oxide breakdown, so as to carry out the anti-fuse operation on the NOI nonvolatile memory device.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a non-overlapped-extension-implantation (NOI) nonvolatile memory device according to the present invention, embodiments of the present invention will be described in detail with reference to the attached drawings hereinafter.

Figure 2:
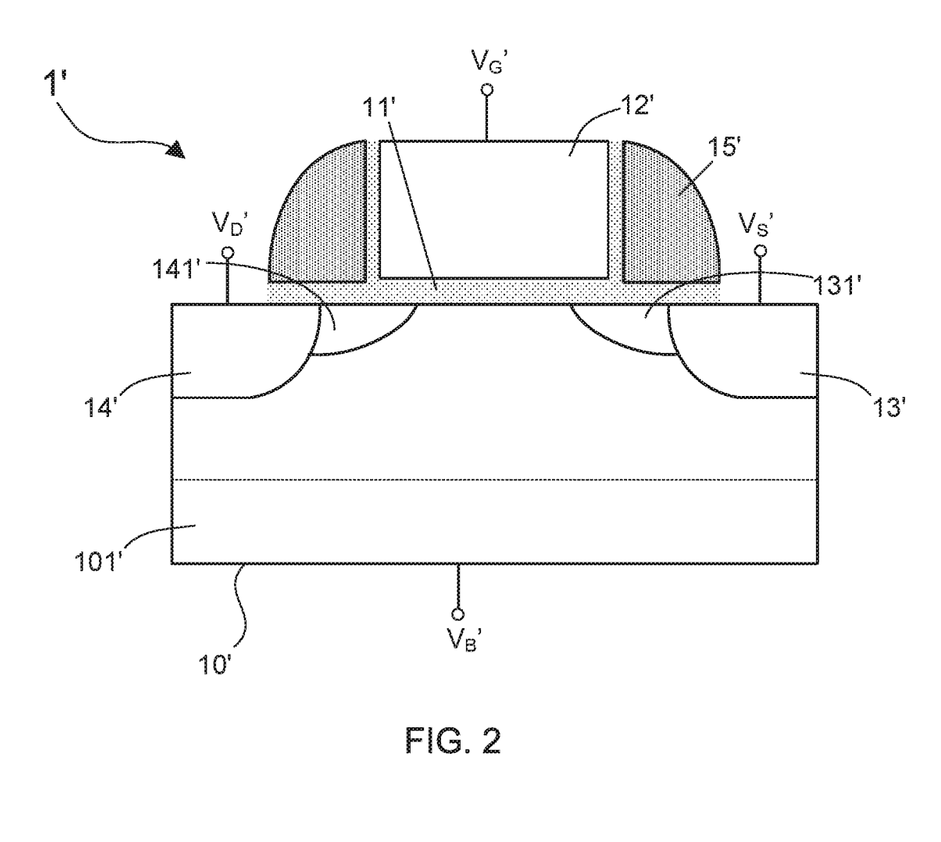
FIG. 2 shows a schematic cross-sectional view of a conventional MOSFET device.

For facilitating the engineers skilled in nonvolatile memory fields be able to easily understand the NOI nonvolatile memory provided by the present invention, a standard MOSFET (Metal-Oxide-Semiconductor Field-Effect Transistor) device must be introduced in advance. Please refer to FIG. 2, there is shown a schematic cross-sectional view of a conventional MOSFET device. As shown in FIG. 2, the conventional MOSFET device 1' consists of: a substrate 10', a gate oxide layer 11', a gate layer 12', a source region 13', a drain region 14', and two sidewall spacers 15'; wherein an active region 101' is further formed in the substrate 10'.

It is well known that a drain current and a source current of the MOSFET device 1' can be read out by treating the MOSFET device 1' with a forward-read operation and a reverse-read operation. Herein, the apply voltage conditions for the forward-read operation and the reverse-read operation are listed in following Table (1).

TABLE (1)

| | forward-read operation | reverse-read operation |
|---|---|---|
| Gate Voltage ($V_G'$) | $V_G' \geq V_{th}$ (threshold voltage) | $V_G' \geq V_{th}$ (threshold voltage) |
| Substrate Voltage ($V_B'$) | $V_B'$ = GND | $V_B'$ = GND |
| Drain Voltage ($V_D'$) | $V_D'$ = constant voltage | $V_D'$ = GND |
| Source Voltage ($V_S'$) | $V_S'$ = GND | $V_S'$ = constant voltage |

Figure 3:
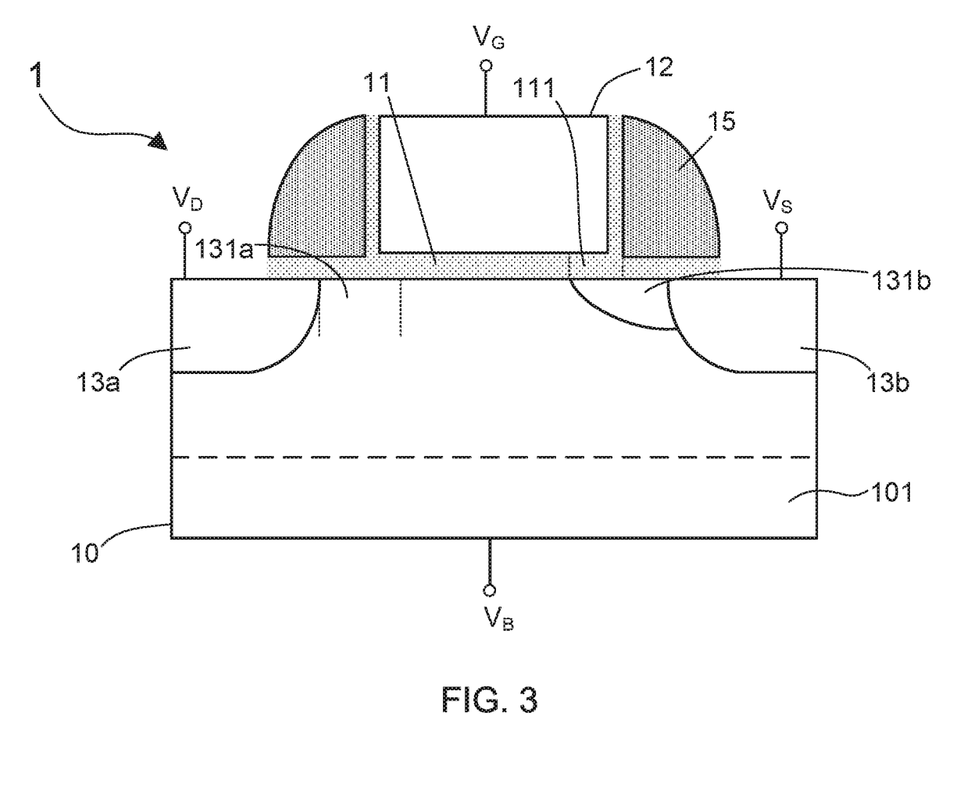
FIG. 3 shows a schematic cross-sectional diagram of a non-overlapped-extension-implantation (NOI) nonvolatile memory device capable of being treated with anti-fuse operation according to the present invention.

In follows, it will detailedly introduce the NOI nonvolatile memory device provided by the present invention. Please refer to FIG. 3, where a schematic cross-sectional diagram of the NOI nonvolatile memory device is shown. As shown in FIG. 3, the NOI nonvolatile memory device 1 is consisted of: a silicon substrate 10, a gate oxide layer 11 formed on the silicon substrate 10, a gate layer 12 formed on the gate oxide layer 11, a first diffusion region 13a, a lightly doped drain (LDD) region 131b, a second diffusion region 13b, and a non-lightly doped drain (non-LDD) region 131a. In which, an active region 101 is formed in the silicon substrate 10, and the first diffusion region 13a and the second diffusion region are also formed in the silicon substrate 10 opposite to each other. The same to the MOSFET device, each of the first diffusion region 13a and the second diffusion region 13b are a high-concentration ion implantation region, i.e., the Drain region and the Source region.

In addition, the LDD region 131b is formed in the silicon substrate and adjacent to the first diffusion region 13a, wherein the gate oxide layer 11 has an overlapped oxide segment 111 between the gate layer 12 and the LDD region 131b. Differing from the conventional MOSFET device, this NOI nonvolatile memory device 1 has a non-lightly doped drain (non-LDD) region 131a formed in the silicon substrate 10. The non-LDD region 131a is a non-overlapped-extension-implantation region and adjacent to the second diffusion region 13b, moreover, the non-LDD region 131a is also oppositely locates below the gate layer 12.

The same to conventional MOSFET device, there are two sidewall spacers 15 respectively formed on the two sidewalls of the gate layer 12. Moreover, a metal compound layer (not shown) is formed on the gate layer 12, the first diffusion region 13a, and the second diffusion region 13b. The manufacturing material of the said metal compound can be metal silicide, metal germanide and combination of the aforesaid two materials.

Particularly, this NOI nonvolatile memory device 1 can be written with at least one bit through an anti-fuse operation. Moreover, the bit stored in the NOI nonvolatile memory device 1 can be read out through a read operation. Herein, the apply voltage conditions for the anti-fuse operation and the read operation are listed in following Table (2).

TABLE (2)

|  | anti-fuse operation | read operation |
|---|---|---|
| Gate Voltage ($V_G$) | $V_G = V_{pp}$ (programming voltage) | $V_G = V_{DD}$ (constant voltage) |
| Substrate Voltage ($V_B$) | $V_B = $ GND | $V_B = $ GND |
| Drain Voltage ($V_D$) | $V_D = $ floating | $V_D = $ GND |
| Source Voltage ($V_S$) | $V_S = $ GND | $V_S = $ floating |

Figure 4:
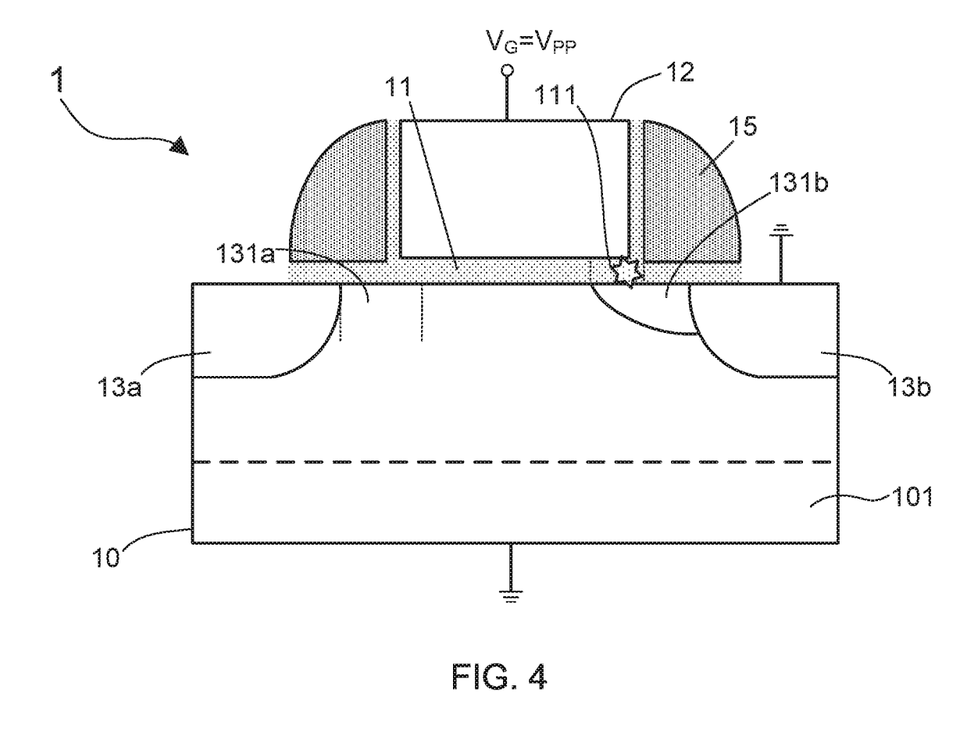
FIG. 4 shows a schematic diagram of an anti-fuse operation applied to the NOI nonvolatile memory device.

Please refer to FIG. 4, which illustrates a schematic diagram of the anti-fuse operation applied to the NOI nonvolatile memory device is illustrated. As FIG. 4 shows, when the NOI nonvolatile memory device 1 is treated with the anti-fuse operation, a high electric filed would be induced in the overlapped oxide segment 111 because a voltage difference is applied between the gate layer 12 and the silicon substrate 10; therefore, the high electric filed would make the overlapped oxide segment 111 occur oxide breakdown, so as to carry out the anti-fuse operation on the NOI nonvolatile memory device 1.

Herein, it needs to further explain that, because a loose-coupling fringing capacitor is physically formed between the first diffusion region 13a and the gate layer 12, the high electric filed would be prevented from being coupled into a non-overlapped oxide segment of the gate oxide layer 11 locating over the non-LDD region 131a. Therefore, non-overlapped oxide segment of the gate oxide layer 11 is protected from occurring oxide breakdown when the NOI nonvolatile memory device 1 is treated with the anti-fuse operation.

Figure 5:
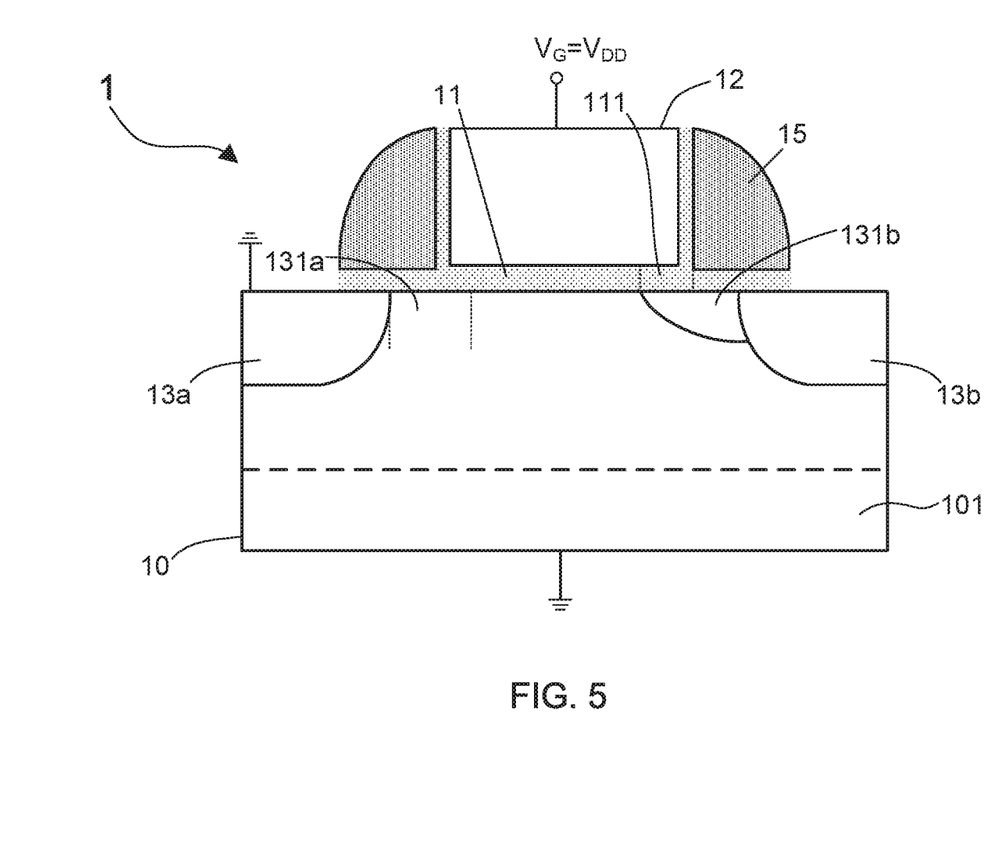
FIG. 5 shows a schematic diagram of a read operation applied to the NOI nonvolatile memory device.

After the NOI non-volatile memory device 1 is written with one bit, the programmed bit can further be read out through the read operation. Please refer to FIG. 5, which shows a schematic diagram of the read operation applied to the NOI nonvolatile memory device 1. As shown in FIG. 5, a read current of the NOI nonvolatile memory device 1 can be read out after the read operation is applied to the NOI nonvolatile memory device 1. Furthermore, the bit stored in the NOI nonvolatile memory device 1 can be recognized as bit "0" or bit "1" by comparing the read current with a reference current.

Therefore, through above descriptions, the non-overlapped-extension-implantation (NOI) nonvolatile memory device capable of being treated with anti-fuse operation proposed by the present invention has been introduced completely and clearly; in summary, the present invention includes the advantages of:

(1) Differing from conventional anti-fuse memory devices, the structure and fabrication of this NOI nonvolatile memory device are complied with currently-used standard COMS processes; that is, the NOI nonvolatile memory device provided by the present invention can be manufactured through the standard COMS processes, without using any additional masks for defining specific oxide layer.

(2) Moreover, after the NOI nonvolatile memory device is treated with the anti-fuse operation, the Gate and Drain of the NOI nonvolatile memory device still propose the switching characteristic the same to the traditional MOSFET, resulting from the oxide breakdown caused by a high electric filed merely occur in an overlapped oxide segment of the gate oxide layer.

Figure 6:
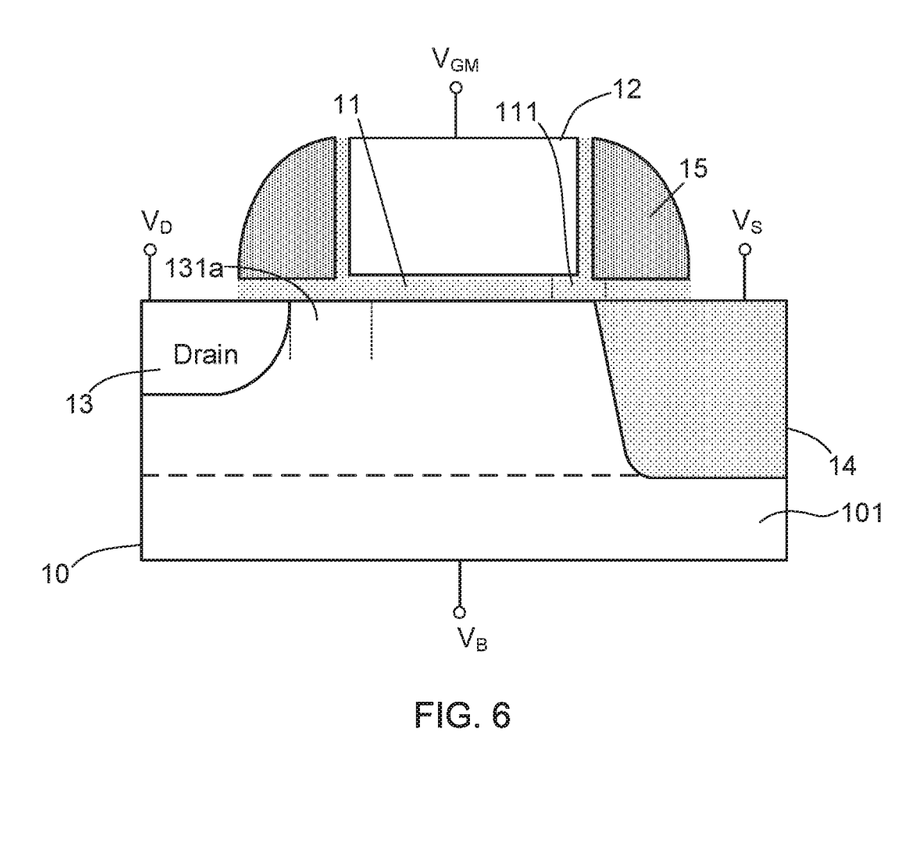
FIG. 6 shows a schematic cross-sectional diagram of a second embodiment for the NOI nonvolatile memory device capable of being treated with anti-fuse operation according to the present invention.

Continuously, a second embodiment for the NOI nonvolatile memory device will be introduced in following paragraphs. Please refer to FIG. 6, where a schematic cross-sectional diagram of the second embodiment for NOI nonvolatile memory device is shown. As shown in FIG. 6, the second embodiment of the NOI nonvolatile memory device 1 is consisted of: a silicon substrate 10, a gate oxide layer 11 formed on the silicon substrate 10, a gate layer 12 formed on the gate oxide layer 11, a diffusion region 13, a non-lightly doped drain (non-LDD) region 131, and a shallow trench isolation (STI) oxide region 14. In which, an active region 101 is formed in the silicon substrate 10, and the diffusion region 13 and the STI oxide region 14 are formed in the silicon substrate 10 opposite to each other. The same to the MOSFET device, the diffusion region 13 is a high-concentration ion implantation region, i.e., the Drain region or the Source region.

As shown in FIG. 6, the gate oxide layer 11 has an overlapped oxide segment 111 locating between the gate layer 12 and the STI oxide region 14. On the other hand, it is able to say that, the STI oxide region 14 has an overlapped portion oppositely locating below the gate layer 12. Differing from the conventional MOSFET device, this NOI nonvolatile memory device 1 has a non-lightly doped drain (non-LDD) region 131 formed in the silicon substrate 10; moreover, the non-LDD region 131 is adjacent to the diffusion region 13 and oppositely locates below the gate layer 12. The same to conventional MOSFET device, there are two sidewall spacers 15 respectively formed on the two sidewalls of the gate layer 12.

The same to above-described embodiment, the second embodiment of the NOI nonvolatile memory device 1 can be written with at least one bit through an anti-fuse operation. Moreover, the bit stored in the NOI nonvolatile memory device 1 can be read out through a read operation. Herein, the apply voltage conditions for the anti-fuse operation and the read operation are listed in following Table (3).

TABLE (3)

|  | anti-fuse operation | read operation |
|---|---|---|
| Gate Voltage ($V_G$) | $V_G = V_{pp}$ (programming voltage) | $V_G = V_{DD}$ (constant voltage) |
| Substrate Voltage ($V_B$) | $V_B = $ GND | $V_B = $ GND |
| Drain Voltage ($V_D$) | $V_D = $ GND | $V_D = V_{read}$ (read voltage) |
| Source Voltage ($V_S$) | $V_S = $ floating | $V_S = $ floating |

Figure 7:
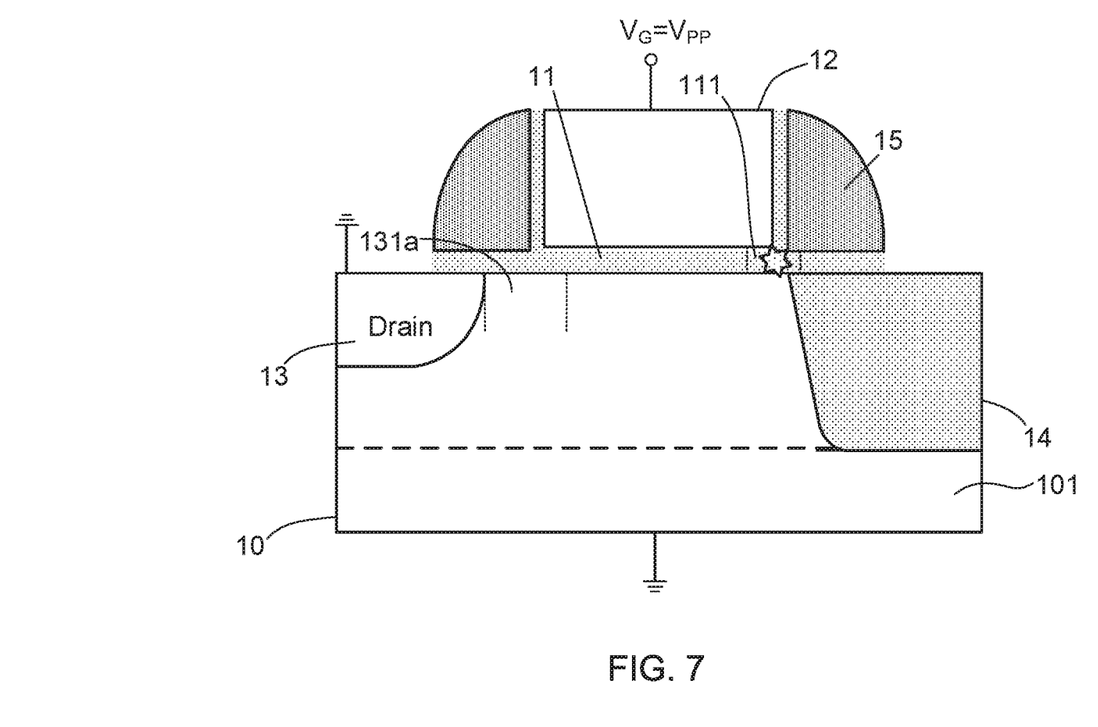
FIG. 7 shows a schematic diagram of an anti-fuse operation applied to the second embodiment of the NOI nonvolatile memory device.

With reference to FIG. 7, where a schematic diagram of the anti-fuse operation applied to the second embodiment of the NOI nonvolatile memory device is illustrated. As FIG. 7 shows, when the NOI nonvolatile memory device 1 is treated with the anti-fuse operation, a high electric filed would be induced in the overlapped oxide segment 111 because a voltage difference is applied between the gate layer 12 and the silicon substrate 10; therefore, the high electric filed would make the overlapped oxide segment 111 occur oxide breakdown, so as to carry out the anti-fuse operation on the NOI nonvolatile memory device 1.

Herein, it needs to further explain that, because a loose-coupling fringing capacitor is physically formed between the diffusion region 13 and the gate layer 12, the high electric filed would be prevented from being coupled into a non-overlapped oxide segment of the gate oxide layer 11 locating over the non-LDD region 131. Therefore, non-overlapped oxide segment of the gate oxide layer 11 is protected from occurring oxide breakdown when the NOI nonvolatile memory device 1 is treated with the anti-fuse operation.

Figure 8:
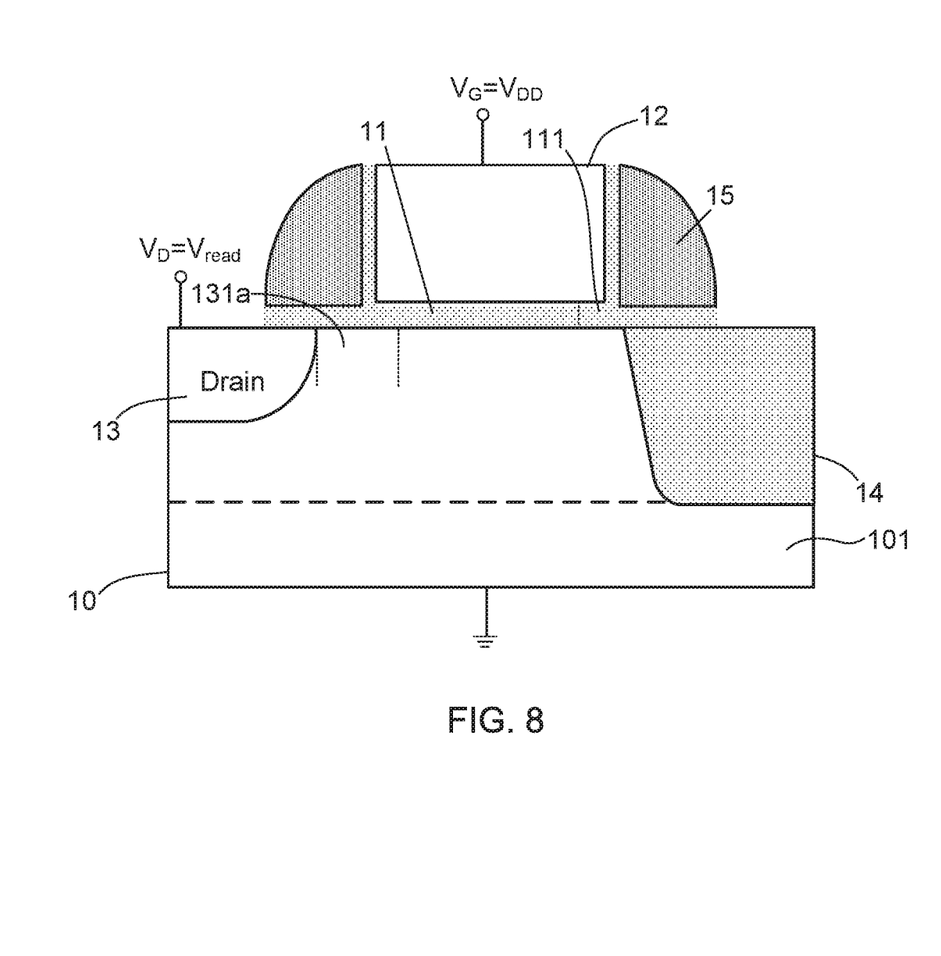
FIG. 8 shows a schematic diagram of a read operation applied to the second embodiment of the NOI nonvolatile memory device.

After the NOI non-volatile is written with one bit, the programmed bit can further be read out through the read operation. Please refer to FIG. 8, which shows a schematic diagram of the read operation applied to the NOI nonvolatile memory device. As shown in FIG. 8, a read current of the NOI nonvolatile memory device 1 can be read out after the read operation is applied to the NOI nonvolatile memory device 1. Furthermore, the bit stored in the NOI nonvolatile memory device 1 can be recognized as bit "0" or bit "1" by comparing the read current with a reference current.

The above description is made on embodiments of the present invention. However, the embodiments are not intended to limit scope of the present invention, and all equivalent implementations or alterations within the spirit of the present invention still fall within the scope of the present invention.

What is claimed is:

1. A non-overlapped-extension-implantation (NOI) non-volatile memory device capable of being treated with anti-fuse operation, comprising:
    a silicon substrate;
    a gate oxide layer, being formed on the silicon substrate;
    a gate layer, being formed on the gate oxide layer;
    a diffusion region, being formed in the silicon substrate;
    a non-lightly doped drain (non-LDD) region, being formed in the silicon substrate and adjacent to the diffusion region; moreover, the non-LDD region oppositely locating below the gate layer; and
    a shallow trench isolation (STI) oxide region, being formed in the silicon substrate opposite to the diffusion region; wherein the gate oxide layer has an overlapped oxide segment locating between the gate layer and the STI oxide region;
    wherein a high electric filed would be induced in the overlapped oxide segment by forming a voltage difference between the gate layer and the silicon substrate; therefore, the high electric filed would make the overlapped oxide segment occur oxide breakdown, so as to carry out the anti-fuse operation on the NOI nonvolatile memory device.

2. The NOI nonvolatile memory device of claim 1, wherein the diffusion region is provided with a plurality of ions having polarity therein through ion implantation process.

3. The NOI nonvolatile memory device of claim 1, further comprising a metal compound layer, formed on the gate layer, the first diffusion layer and a second diffusion layer.

4. The NOI nonvolatile memory device of claim 3, wherein the manufacturing material of the metal compound layer is selected from the group consisting of: metal silicide, metal germanide and combination of the aforesaid two materials.

5. The NOI nonvolatile memory device of claim 1, wherein each of two sidewalls of the gate layer are formed with a sidewall spacer.

* * * * *